United States Patent
Hayes

(10) Patent No.: US 7,240,258 B1
(45) Date of Patent: Jul. 3, 2007

(54) PARALLEL TEST SYSTEM AND METHOD

(75) Inventor: Todd A. Hayes, Macedonia, OH (US)

(73) Assignee: Keithley Instruments, Inc., Cleveland, OH (US)

(*) Notice: Subject to any disclaimer, the term of this patent is extended or adjusted under 35 U.S.C. 154(b) by 571 days.

(21) Appl. No.: 10/256,839

(22) Filed: Sep. 27, 2002

(51) Int. Cl.
G01R 31/3177 (2006.01)
G01R 31/327 (2006.01)

(52) U.S. Cl. .................... 714/724; 714/718

(58) Field of Classification Search ............ 714/724, 714/718, 699, 100, 25, 30, 32, 37, 40, 48; 324/763, 765, 527; 365/200, 201
See application file for complete search history.

(56) References Cited

U.S. PATENT DOCUMENTS

| | | | |
|---|---|---|---|
| 4,639,664 A | 1/1987 | Chiu et al. | |
| 5,543,727 A * | 8/1996 | Bushard et al. | 324/760 |
| 5,744,948 A * | 4/1998 | Swart | 324/158.1 |
| 5,969,538 A * | 10/1999 | Whetsel | 324/763 |
| 6,092,225 A | 7/2000 | Gruodis et al. | |
| 6,158,032 A | 12/2000 | Currier et al. | |
| 6,196,677 B1 | 3/2001 | Spano | |
| 6,681,351 B1 * | 1/2004 | Kittross et al. | 714/724 |
| 6,766,486 B2 * | 7/2004 | Neeb | 714/724 |
| 2003/0191996 A1 * | 10/2003 | Mukherjee et al. | 714/724 |

OTHER PUBLICATIONS

Lockhart, Regression Test Procedure, PostgreSQL Inc., chapter 34, pp. 1-2, 2000.*

* cited by examiner

Primary Examiner—Guy Lamarre
Assistant Examiner—Dipakkumar Gandhi
(74) Attorney, Agent, or Firm—Pearne & Gordon LLP

(57) ABSTRACT

A parallel test device for testing a DUT includes a controller that has a test procedure useful for both sequential and parallel testing, a test regimen that includes a parallel procedure, and a parallel wrapper applied to the test procedure to provide the parallel procedure; and a plurality of test instruments that test the DUT in response to the controller.

4 Claims, 2 Drawing Sheets

PARALLEL TEST SYSTEM AND METHOD

BACKGROUND OF THE INVENTION

The present invention relates to the parametric testing of semiconductor wafers and, in particular, to the contemporaneous performance of such tests.

As semiconductor wafer size has increased (e.g., 200 mm to 300 mm), the number of test measurements has also increased (e.g., doubled). It has become very desirable to perform more tests in less time as testing time corresponds closely to testing costs. Unfortunately, the time for individual tests has already been reduced to minimums constrained by such factors as settling time.

Performing multiple tests contemporaneously, or in parallel, allows more tests to be performed in the same time. However, including parallel test procedures in a testing regimen greatly increases the overall complexity of the regimen. This has heretofore greatly limited the use of parallel testing, because the test writer had to not only decide what tests to perform, but also, deal with the complex issues of multithreaded programming.

SUMMARY OF THE INVENTION

A parallel test device for testing a DUT includes a controller that has a test procedure useful for both sequential and parallel testing, a test regimen that includes a parallel procedure, and a parallel wrapper applied to the test procedure to provide the parallel procedure; and a plurality of test instruments that test the DUT in response to the controller.

DESCRIPTION OF THE PREFERRED EMBODIMENTS

Figure 1:
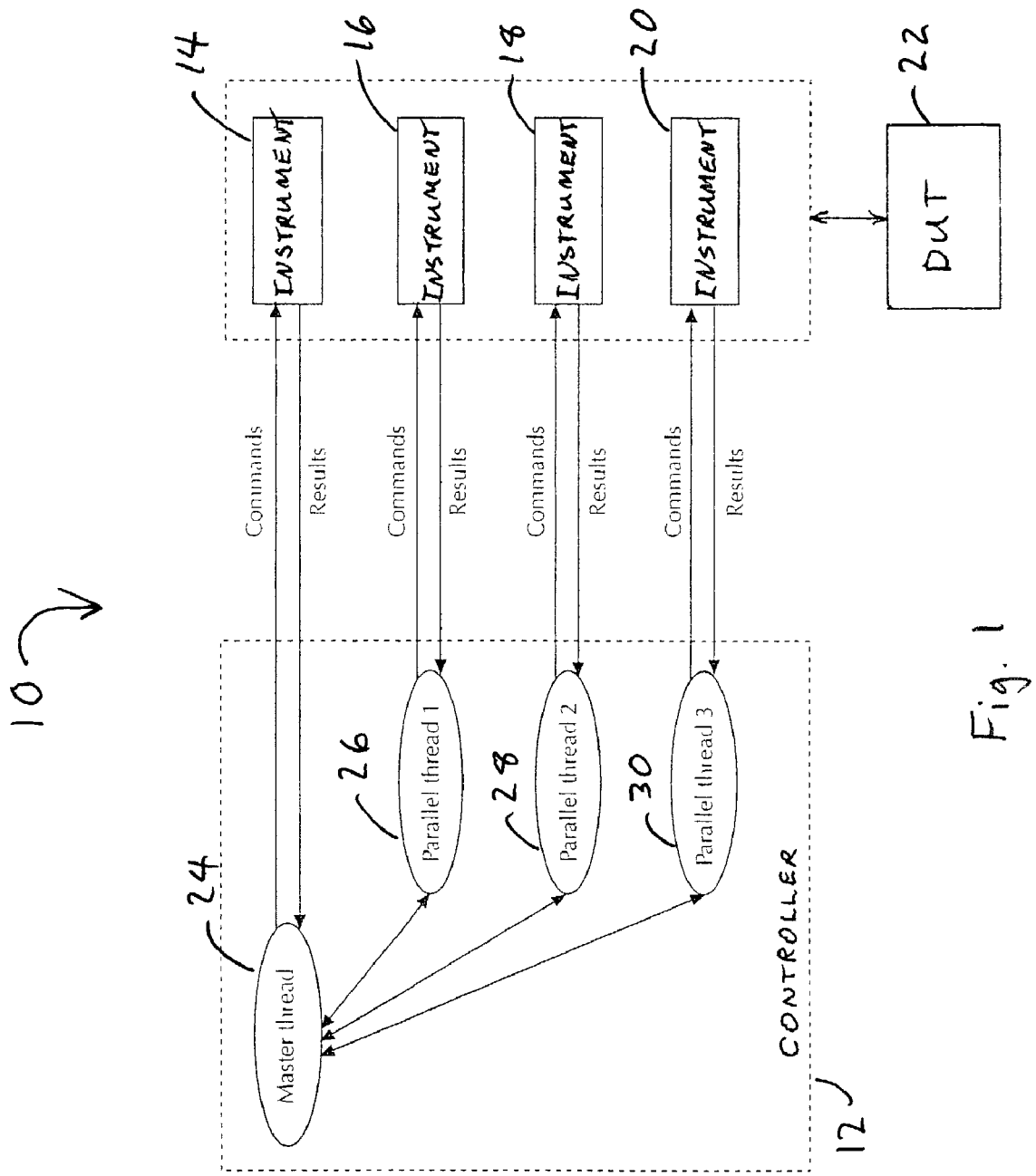
FIG. 1 is a block diagram of a device according to the invention.

Referring to FIG. 1, a parallel test device 10, includes a controller 12, test instruments 14, 16, 18, 20 and a device under test (DUT) 22. The controller 12 may be, for example, a computer workstation. The instruments 14, 16, 18, 20 may be, for example, source measure units, capacitance meters, or other measurement devices. The instruments 14, 16, 18, 20 may also include, for example, individual or common controllers of their own (e.g., microprocessors, programmable controllers, personal computers and ancillary circuitry/mechanisms) for such functions as measurement control, timers, positioning, selection, switching and data communications. The DUT 22 may be, for example, a semiconductor wafer, or other specimen(s) or device(s) to be tested.

A master thread 24 of a control program in the controller 12 controls the testing of the DUT 22. The tests may include conventional sequential tests directly controlled by the master thread 24. In the illustrated embodiment, the instrument 14 is being used in a sequential test. In addition, the master thread 24 controls parallel threads 26, 28, 30 that can be performed contemporaneously with each other. In the illustrated embodiment, the instruments 16, 18, 20 are being controlled by the parallel threads 26, 28, 30, respectively. It is of course to be understood that the correspondence between threads and instruments may change as a test regimen proceeds. Sequential tests should wait until any currently executing group of parallel tests complete before continuing in sequence.

Various issues arise in a parallel test. For example, it may not be possible to share the same instrument contemporaneously, routing/connection states as provided by switching matrix cannot be changed by one parallel test if it will interfere with another parallel test, performing certain tests will effect the results of other tests. In addition, there are various issues related to the use of parallel software threads themselves, such as allocating the threads themselves, monitoring and synchronizing the threads, and scheduling resources for each thread.

Figure 2:
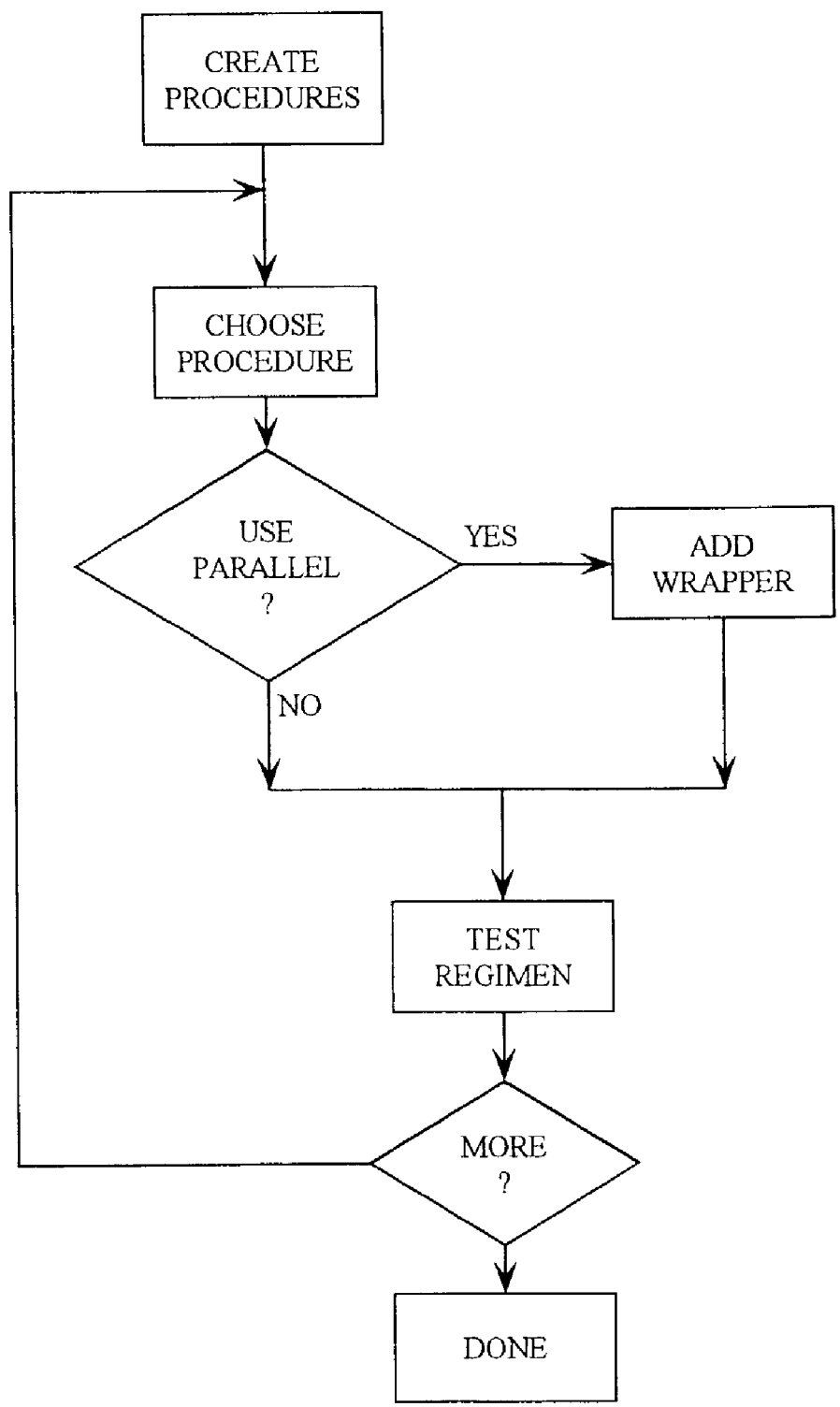
FIG. 2 is a flow chart of a method according to the invention.

Referring to FIG. 2, the present invention separates the details of parallel programming from the test designer/user. The designer creates the desired tests (e.g., use instrument nn to measure the voltage between two defined points A, B on the DUT 24), including tests that may be performed either sequentially or in parallel. The controller 12 then creates the necessary instructions to perform this test in a sequential manner and also creates additional instructions or code to allow the test to be performed in a parallel manner. This additional code or parallel wrapper includes the additional parameters that must be passed to a parallel process so that a master thread can control it and, also, may include the additional constraints that may exist on performing a test in parallel.

To design a test regimen, the designer chooses from the test procedures that have been designed. If the designer does not desire a parallel test, the procedure is just added to the test regimen. If one or more procedures are to be performed in parallel, a parallel wrapper is added to the test by the controller 12 for use in the test regimen. The process continues until the test regimen is finished.

Real time, multithreaded programming is well-known, but it is not something a test designer should be required to deal with. The present invention, allows the test designer to concentrate on designing test regimens, while details of performing parallel tests are taken care of by the controller.

When the controller generates the wrapper code for a test procedure it essentially hides the details and complexities from the test designer so it is not necessary to understand anything more about multithreaded programming.

At run time, access to the instruments 14, 16, 18, 20 is controlled by the threading context of the calling routine. The controller 12 maintains a separate control context for each parallel thread. When a group of parallel threads are completed the master thread continues sequentially until another parallel group is encountered.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A parallel test device for testing a DUT, said device comprising: a controller, said controller including: a test procedure for both sequential and parallel testing; a test regimen, said test regimen including a parallel procedure; and a parallel wrapper applied to said test procedure to provide said parallel procedure; wherein when a parallel procedure is desired, the parallel wrapper provides the additional instructions or code to allow a sequential procedure to be used as a parallel procedure; and a plurality of test instruments, said instruments testing said DUT in response to said controller.

2. A device according to claim 1, wherein said controller further includes another test procedure, said another test procedure is for both sequential and parallel testing and wherein said test regimen further includes a sequential procedure, said another test procedure being used as said sequential procedure.

3. A method for testing a DUT, said method comprising: creating a test procedure for both sequential testing and parallel testing; constructing a test regimen for said DUT that includes a parallel procedure; applying a parallel wrapper to said test procedure to provide said parallel procedure; wherein when a parallel procedure is desired, the parallel wrapper provides the additional instructions or code to allow a sequential procedure to be used as a parallel procedure; and performing said test regimen on said DUT.

4. A method according to claim 3, further comprising creating another test procedure for both sequential and parallel testing, including a sequential procedure in said regimen, and using said another test procedure as said sequential procedure.

* * * * *